United States Patent [19]

Mizobata et al.

[11] Patent Number: 5,559,738
[45] Date of Patent: Sep. 24, 1996

[54] SEMICONDUCTOR DATA STORAGE APPARATUS

[75] Inventors: Akira Mizobata; Masanori Nagahama, both of Sanda; Tadakatu Watanabe, Itami, all of Japan

[73] Assignee: Mitsubishi Denki Kabushiki Kaisha, Tokyo, Japan

[21] Appl. No.: 361,723

[22] Filed: Dec. 22, 1994

[30] Foreign Application Priority Data

Dec. 27, 1993 [JP] Japan .................................. 5-330479

[51] Int. Cl.$^6$ .................................................. G06K 19/07
[52] U.S. Cl. .............................. 365/189.01; 365/189.04; 365/189.07; 365/230.03; 365/230.06; 365/239
[58] Field of Search .................................. 365/218, 185, 365/201, 230.03, 189.04, 189.07, 230.06, 239, 189.01; 395/400, 425

[56] References Cited

U.S. PATENT DOCUMENTS

| | | | |
|---|---|---|---|
| 4,931,997 | 6/1990 | Mitsuishi et al. ........................ | 365/218 |
| 5,355,342 | 10/1994 | Ueoka ........................................ | 365/201 |
| 5,363,330 | 11/1994 | Kobayashi et al. ..................... | 365/185 |
| 5,426,753 | 6/1995 | Moon ........................................ | 395/400 |

*Primary Examiner*—Viet Q. Nguyen
*Attorney, Agent, or Firm*—Leydig, Voit & Mayer

[57] ABSTRACT

A semiconductor data storage apparatus having a plurality of memory devices which are switched to a predetermined mode when a software command has been written, which have waiting time during execution of the command after the command has been written and from which data can be collectively erased, the semiconductor data storage apparatus being arranged to shorten the time required to erase data. A memory device is activated in response to a memory selection signal supplied by a decoder, a write enable signal, which has been, by an AND gate circuit, selectively supplied in response to the selection signal, brings the memory device into a write mode, upper address signals are sequentially switched during a waiting time during execution of erasure after an erase command has been written so as to sequentially write erase commands on next memory devices by the decoder and AND gate circuits.

2 Claims, 9 Drawing Sheets

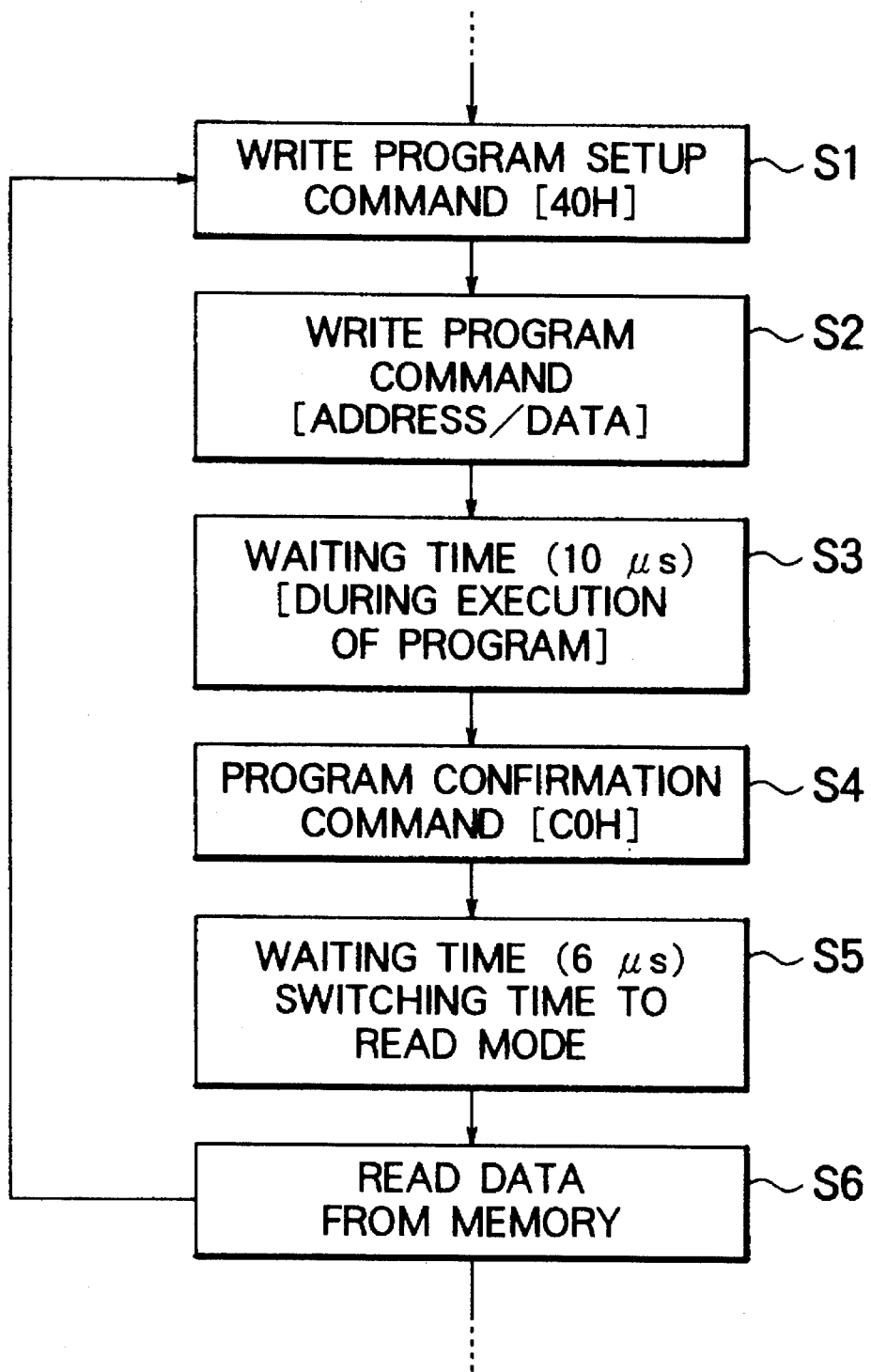

SEMICONDUCTOR DATA STORAGE APPARATUS

BACKGROUND OF THE INVENTION

1. Field of the Invention

This invention relates to a semiconductor data storage apparatus, on which a memory device, such as a flash memory, is mounted which enables data to be collectively erased from the overall memory region or each block in the memory thereof, and, more particularly, to shortening the time required to erase or program (write) data.

2. Description of the Related Art

FIG. 7 is a block diagram which schematically illustrates the structure of a conventional semiconductor data storage apparatus a collectively-erasable memory device. As an apparatus of the foregoing type, a flash memory card including a plurality of flash memory devices is available. The foregoing semiconductor storage apparatus is connected to a control unit (not shown) so that data is, under control of the control unit, read, programmed (written) and collectively erased. A flash memory card serving as a portable storage medium is attachably/detachably connected to a terminal unit through a connector so that data is, similarly to the foregoing apparatus, read, programmed and collectively erased under control of the terminal unit.

In a semiconductor storage apparatus 10 shown in FIG. 7, reference numeral 1 represents a input/output signal line group for receiving a variety of control signals, software commands, addresses and data to be written, which are supplied from the control unit, and for transmitting stored data to the control unit, the signal lines being connected to the control unit. Reference numeral 2 represents a memory portion which consists of a plurality of collectively-erasable memory devices 2a to 2k. Reference numeral 3 represents a decoder for selectively activating each memory device in the memory portion 2 in response to a signal supplied from the input/output signal line group 1. Each of the memories 2a to 2k of the memory portion 2 comprises a collectively-erasable flash EEPROM. The memory device of the foregoing type is exemplified by 5M28F101P, FP, J, VP, RV or 5M28F102P, FP, J, VP, RV or the like. The decoder 3 comprises, for example, 74ALS138.

In the input/output signal line group 1, reference numeral 1a represents a lower address signal line group ($A_0$ to $A_n$) for addressing each of the memory devices 2a to 2k. Reference numeral 1c represents an output enable signal line (OE bar) for bringing the memory device to a data readable state. Reference numeral 1d represents a write enable signal line (WE bar) for bringing the memory device to a state where data and a software command can be written. Reference numeral 1f represents a data bus (DA) through which data to be stored or stored data is input to/output from the memory device and through which a software command is input to the memory device. The signal lines 1a, 1c, 1d and 1f are connected to the memory devices 2a to 2k. Reference numeral 1b represents an upper address signal line group ($A_{n+1}$ to $A_m$) for specifying a memory device in the memory portion 2 that is activated. Reference numeral 1e represents an enable signal line (CE bar) for activating the decoder 3, that is, the semiconductor storage apparatus 10. The signal lines 1b and 1e are connected to the decoder 3. Reference numerals 3a to 3k represent memory selection signal lines (S bar). The decoder 3 supplies, through the memory selection signal lines 3a to 3k, a memory selection signal for activating a predetermined memory device in response to the signal supplied through the upper address signal line group 1b. Vcc represent a power supply source for supplying normal operating voltage to the memory device, and Vpp represents a power supply source for switching and supplying a voltage required when data is read from the memory device or required when data is programmed or erased. Also the voltages Vcc and Vpp are supplied from the control unit (not shown). Note that the signal lines and the signals to be transmitted through the signal lines are given the same reference numerals.

The operation of the circuit in the semiconductor storage apparatus 10 shown in FIG. 7 will now be described, the circuit being a negative logic circuit.

Initially, the operation of the flash EEPROM that constitutes each of the memory devices 2a to 2k of the memory device 2 will be schematically described. Each of the memory devices 2a to 2k comprising the flash EEPROM has two operation modes consisting of a read only mode and a read/write mode that can be switched in accordance with the voltage level of the power supply source Vpp. In a case where the power supply source Vpp is at a low level of VppL (for example, 5 V), the read only mode is set in which data can be read. If the power supply source Vpp is at a high level of VppH (for example, 12 V), the read/write mode is set in which data can be read, programmed and erased.

When each of the memory devices is in the read only mode because the power supply source VDp has been set to the low level VppL, the read mode is realized by setting the memory selection signals (S bar) 3a to 3k and the output enable signal (OE bar) 1c to the low level and by setting the write enable signal (WE bar) 1d to the high level. Thus, stored data appears in the data bus 1f in accordance with the lower address signals ($_0$ to $A_n$).

When the power supply source Vpp has been set to the high level VppH and thus the read/write mode has been set, the write mode is realized by setting the write enable signal (WE bar) 1d to the low level in a state where the level of the memory selection signal (S bar) is low and that of the output enable signal (OE bar) 1c is high. Thus, a software command can be input through the data bus 1f. In accordance with the content of the software command, data can be programmed or erased. Each memory device has a command latch circuit, an internal control circuit (not shown, respectively) and the like. The software command latched by the command latch circuit serves as an input for the internal control circuit. Thus, the output from the internal control circuit causes programming or erasure.

The foregoing fact will now be described in terms of the software command. When the power supply source Vpp is at the low level VppL, the content of the command latch circuit is automatically set to a content that indicates the read only mode. Therefore, writing of a software command is inhibited. When the power supply source Vpp is on the high level VppH, the memory device is brought to the read/write mode as described above. Therefore, the operation of the memory device is selected by writing a specific software command in the command latch circuit.

The total operation of the semiconductor data storage apparatus 10 will now be described. The semiconductor storage apparatus 10 is connected to the control unit (not shown) through the input/output signal line group 1 as described above and is operated under control of the control unit. The semiconductor data storage apparatus 10 is activated when it receives a low level enable signal (CE bar) 1e. When the semiconductor storage apparatus 10 has been activated, the decoder 3 supplies the low level memory selection signal (S bar) to a predetermined memory device in the memory portion 2 in accordance with the upper address signals ($A_{n+1}$ to $A_m$) 1b to activate the memory device. That is, when the upper address signal 1b for selecting, for example, the memory device 2a has been supplied, the memory selection signal 3a is made to be the low level and the residual memory selection signals 3b to 3k are made to be the high level. The selected memory device is brought to the read only mode or the read/write mode in accordance with the level of the power supply source Vpp. Thus, the memory device is operated in response to any of a variety of control signals, software commands, addresses and data supplied by the control unit.

The operation of each of the memory devices 2a to 2k in the read only mode realized by setting the power supply source Vpp to the low level VDpL will now be described. A consideration is performed in a case where data in the memory device 2a is read. When a predetermined upper address signal 1b is supplied, the decoder 3 lowers the level of only the memory selection signal 3a to selectively activate the memory device 2a. Since the power supply source Vpp has been set to the low level VppL, the memory device 2a has been set to the read only mode. Therefore, setting of the output enable signal (OE bar) 1c to the low level and setting of the write enable signal (WE bar) 1d to the high level bring the mode to the read mode as described above. As a result, data stored in the data bus If appears in accordance with the lower address signals ($A_0$ to $A_n$).

Description will be made about the operation of each of the memory devices 2a to 2k in the read/write mode realized by setting the power supply source Vpp to the high level VppH, in particular, in the write mode in which data is programmed or erased. FIG. 8 illustrates a portion of a flow chart of an operation of erasing data in each memory device, which is a flash EEPROM, to be performed in the write mode. FIG. 9 illustrates a portion of a flow chart of a programming operation.

An operation of erasing data from the memory device 2a or programming data in the same will now be described. The operation to be performed until the memory device 2a is selectively activated is the same as the operation to be performed in the read only mode. Since the power supply source Vpp has been set to the high level VppH, the memory device 2a is in the read/write mode. Therefore, by setting the write enable signal (WE bar) 1d to the low level and by setting the output enable signal (OE bar) 1c to the high level, the memory device 2a is brought to the write mode. Thus, writing of a software command on the included command latch circuit (not shown) is enabled.

Initially, an operation to be performed when data in the memory device 2a is erased will now be described with reference to FIG. 8. When an erase command, which is a software command, has been written in the command latch circuit of the memory device 2a by the control unit, the memory device 2a is brought to the erase mode. The erase command is a command for collectively erasing all data bytes in the memory device. For example, a cycle of writing "20H" in the command latch circuit is repeated two times (steps S1 and S2). The reason for repeating the cycle two times is that an erroneous erasure must be prevented. Then, the erasing operation is performed for about 10 ms so that all data items in the memory device 2a are erased. The period of the foregoing erasing operation is the waiting time (step S3). After the erasing operation has been completed, an erase confirmation command (for example "AOH") for confirming that data has been erased is written (step S4). The, the time of about 6 μs passes during which the memory device 2a is switched to the read mode, the foregoing time being waiting time (step S5). Then, the control unit reads data from the memory device 2a and a confirmation is performed as to whether all data items, which have been read, are "FFH" so that whether or not data has been erased is confirmed (step S6).

In a case where data items in the memory devices 2a to 2k are sequentially erased similar to the operation above, the upper address signal 1b is switched to cause the decoder 3 to select a predetermined memory device. Thus, data is erased by a similar procedure and the procedure is repeated.

The operation to be performed when data is programmed on the memory device 2a will now be described with reference to FIG. 9. When a program command, which is a software command, has been written in the command latch circuit of the memory device 2a, the memory device 2a is brought to the program mode. In accordance with the program command, "40H" is initially written in the command latch (step S1), and then data for one byte to be programmed and its address are written (step S2). Then, programming of the data is executed for about 10 μs so that data of one byte is programmed in the addressed portion. The foregoing period is the waiting time (step S3). Then, a program confirmation command (for example "COH") is written in order to confirm that the data has been programmed (step S4). The ensuing time is about 6 μs during which the memory device 2a is switched to the read mode and the foregoing time is the waiting time (step S5). Then, the programmed data in the memory device 2a is read by the control unit and a confirmation is made as to whether the data has been programmed correctly (step S6). As a result of the foregoing steps S1 to S6, data of one byte is programmed and the confirmation of programming is performed. The foregoing cycle is repeated by the number that corresponds to the number of bytes of the data to be programmed.

In a case where data items are sequentially programmed in the memory devices 2a to 2k similarly to the above operation, the upper address signal 1b is switched so that a predetermined memory device is selected by the decoder 3. Therefore, data is programmed by a similar procedure and this operation is repeated.

The conventional semiconductor storage apparatus having the foregoing structure, at the time of collectively erasing or programming data, involves a problem in that the time during execution of the command after the command has been written is a waiting time, and the time is elongated in proportion to the capacity of the memory, that is, the number of the memory devices. Thus, the time required to program or erase the data is elongated excessively.

SUMMARY OF THE INVENTION

The present invention is capable of overcoming the foregoing problem and an object of the present invention is to obtain a semiconductor data storage apparatus capable of shortening the time required to collectively erase or program data.

In order to achieve the foregoing object, an arrangement according to a first aspect of the present invention is characterized by a semiconductor data storage apparatus comprising: data storage means having a plurality of memory devices that, in a write mode, collectively erase or program data in accordance with a software command after the software command has been written; memory selection means for supplying memory selection signals for selectively activating the plurality of memory devices in accordance with upper address signals for specifying memory devices that will be activated; and write enable signal selection and supply means for selectively supplying write enable signals for bringing the memory device for the write mode to the same memory devices to which the memory selection signals have been supplied, wherein when one memory device of the data storage means is performing an erase operation, other memory devices are activated and brought to the write mode so that a software command for collective erasure is written.

Another arrangement according to a second aspect of the present invention is characterized by a semiconductor data storage apparatus according to the first aspect wherein the memory selection means comprises a decoder for supplying the memory selection signals in accordance with the upper address signals, and the write enable signal selection and supply means comprises an AND gate circuit for calculating a logical product of the memory selection signal and the write enable signal so as to supply the write enable signal, an AND gate circuit being provided for each of the memory devices.

Another arrangement according to a third aspect of the present invention is characterized by a semiconductor data storage apparatus according to the first aspect wherein the memory selection means comprises a decoder for supplying the memory selection signals in accordance with the upper address signals, and the write enable signal selection and supply means comprises a decoder for a write enable signal that supplies the write enable signals in accordance with the upper address signals.

Another arrangement according to a fourth aspect of the present invention is characterized by a semiconductor data storage apparatus comprising: data storage means having a plurality of memory devices that, in a write mode, collectively erase or program data in accordance with a software command after the software command has been written; memory selection means for supplying memory selection signals for selectively activating the plurality of memory devices in accordance with upper address signals for specifying memory devices that will be activated; and parallel and collective erase control means for invalidating all memory selection signals in accordance with a parallel and collective erase command signal supplied from outside, simultaneously activating all memory devices and bringing all memory devices to the write mode, wherein all memory devices are simultaneously activated by the parallel and collective erase control means in accordance with the parallel and collective erase command signal supplied from outside, all memory devices being brought to the write mode and software commands for collective data erasure are written on all memory devices.

Another arrangement according to a fifth aspect of the present invention is characterized by a semiconductor data storage apparatus according to the fourth aspect wherein the parallel and collective erase control means comprises a first three-state buffer group for invalidating all memory selection signals supplied by the memory selection means in accordance with the parallel and collective erase command signal, a second three-state buffer group for supplying memory selection signals that activate all memory devices in accordance with the parallel and collective erase signal and a write enable signal for bringing each of the memory devices to the write mode.

Another arrangement according to a sixth aspect of the present invention is characterized by a semiconductor data storage apparatus according to the fourth aspect further comprising parallel and collective erase command signal discrimination means for discriminating between input of the parallel and collective erase command signals from outside.

Another arrangement according to a seventh aspect of the present invention is characterized by a semiconductor data storage apparatus according to the sixth aspect wherein the parallel and collective erase command signal is a parallel and collective erase command in the form of parallel signals written through a data bus, and the parallel and collective erase command signal discrimination means comprises a plurality of pull-up resistors and pull-down resistors that generate internal parallel and collective erase commands, a plurality of XOR gate circuits for comparing, for each bit, the internal parallel and collective erase commands and the parallel and the collective erase command supplied from outside, and an AND gate circuit for calculating the logical product of each XOR gate circuit.

Another arrangement according to a eighth aspect of the present invention is characterized by a semiconductor data storage apparatus comprising: data storage means having a plurality of memory devices that, in a write mode, program or collectively erase data in accordance with a software command after the software command has been written; memory selection means for supplying memory selection signals for sequentially activating the plurality of memory devices in accordance with lower address signals for specifying memory devices that will be activated; and write enable signal selection and supply means for sequentially supplying write enable signals for bringing the memory devices to the write mode in accordance with the lower address signals, the write enable signals being supplied simultaneously with the memory selection signals, wherein the plurality of memory devices are, in the write mode, switched whenever the lower address signal is increased by plus one sequentially activated so that software commands for programming data are sequentially written in the plurality of memory devices.

Another arrangement according to a ninth aspect of the present invention is characterized by a semiconductor data storage apparatus according to the eighth aspect wherein the memory selection means comprises a decoder #or supplying the memory selection signals in accordance with the lower address signals, and the write enable signal selection and supply means comprises a decoder for a write enable signal that supplies the write enable signal in accordance with the lower address signal.

A semiconductor data storage apparatus according to a first comprehensive aspect of the present invention according to the first to third aspects comprises the memory selection means for selectively activating memory devices and write enable signal selection and supply means for selectively supplying write enable signals to the activated memory devices. Thus, the memory selection means and the write enable signal selection and supply means bring the next memory device to the write mode to write an erase command so as to collectively erase data in the waiting time during execution of erasure in the data erasing operation. The foregoing process is repeated so as to enable data in all memory devices to be erased in one waiting time.

A semiconductor data storage apparatus according to a second comprehensive aspect of the present invention according to the fourth to seventh aspects comprises a parallel and collective erase command signal supplied from outside of the apparatus and parallel and collective erase control means for forcibly activating all memories in response to the parallel and collective erase command signal. When the parallel and collective erase command signal has been supplied, the parallel and collective erase control means simultaneously activates all memory devices so that the erasing operations can be performed simultaneously.

A semiconductor data storage apparatus according to a third comprehensive aspect of the present invention according to the eighth and ninth aspects comprises memory selection means for activating memory devices and write enable signal selection and supply means for supplying write enable signals to the activated memory devices. Furthermore, the write enable signal selection and supply means and the memory selection means are supplied with lower address signals and an upper address signal is supplied to each memory device.

Thus, data is programmed such that the next memory device is selected whenever the address is increased by plus one so that one byte of data is sequentially programmed on each memory device (data is programmed in the horizontal direction). As a result, one byte data can be programmed on all memory devices in one waiting period.

BRIEF DESCRIPTION OF THE DRAWINGS

FIG. 9 is a portion of a flow chart showing a data programming operation of the semiconductor data storage apparatus.

DESCRIPTION OF THE PREFERRED EMBODIMENT

Figure 1:
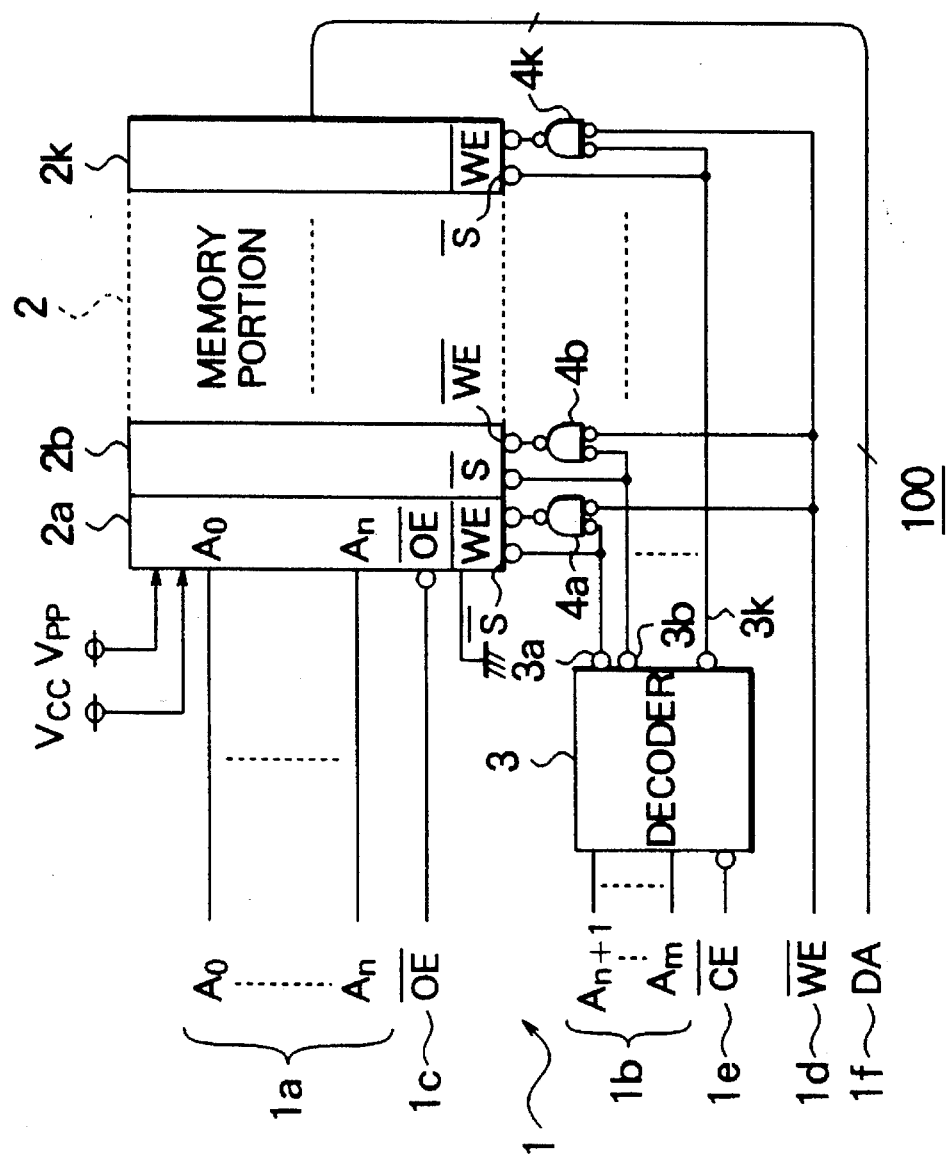
FIG. 1 is a block diagram which illustrates an embodiment of a semiconductor data storage apparatus according to a first aspect of the present invention.

Preferred embodiments of the present invention will now be described with reference to the drawings. First Embodiment FIG. 1 is a block diagram which illustrates an embodiment of a semiconductor data storage apparatus according to a first aspect of the present invention and arranged to shorten the time required to erase data. The same or corresponding portions of the conventional circuit are given the same reference numerals. Also the circuit according to this embodiment is a negative logic circuit. In a semiconductor data storage apparatus 100 shown in FIG. 1, reference numeral represents various input/output lines in which reference numeral 1a represents a lower address signal line group ($A_0$ to $A_n$), 1b represents an upper address signal group ($A_{n+1}$ to $A_m$), 1c represents an output enable signal line (OE bar), 1d represents a write enable signal line (WE bar), 1e represents an enable signal line (CE bar) and 1f represents a data bus (DA). Reference numeral 2 represents a memory portion including a plurality of memory devices 2a and 2k each of which comprises a collectively erasable flash EEPROM. Reference numeral 3 represents a decoder for selecting activating the memory devices 2a to 2k in response to a signal supplied by the upper address signal line group 1b. Reference numerals 3a to 3k represent memory selection signal lines (S bar). The foregoing elements are basically similar to those of the conventional structure. Each of the memory devices 2a to 2k of the memory portion 2 comprises, a flash EEPROM exemplified by 5M28F101P, FP, J, VP, RV or 5M28F102P, FP, J, VP, RV or the like. The decoder 3 comprises, for example, 74ALS138.

The semiconductor data storage apparatus 100 according to the present invention further comprises negative logic AND gate circuits 4a to 4k. Each of the AND product gate circuits 4a to 4k calculates the AND of the memory selection signals 3a to 3k supplied by the decoder 3 and a write enable signal (WE bar) 1d and the obtained AND results are write enable signals (WE bar) for the memory devices 2a to 2k. That is, the low level write enable signal (WE bar) is supplied to only the memory device that has been activated because its memory selection signal (S bar) is at the low level.

A data storage means comprises the memory portion 2, a memory selection means comprises -the decoder 3 and a write enable signal selection and supply means comprises the AND gate circuits 4a to 4k.

In a case where each of the memory devices 2a to 2k is a collectively erasable memory, such as the flash EEPROM, an erase command and an erase confirmation command are written in the erasing mode. Then, the periods 10 ms and 6 μs for executing the corresponding commands must be taken as shown in steps S3 and S5 shown in FIG. 8. The foregoing periods are waiting periods. The semiconductor data storage apparatus 700 according to this embodiment has an arrangement that the foregoing waiting periods are used to enable an collective erasing of data by writing software commands in the other memory devices. Furthermore, the other operations, such as programming and reading of data, can be performed by conventional control. During a period in which the command is performed after the software command has been written on the memory device, the write enable signal (WE bar) for the memory device must be at the high level. The AND gate circuits 4a to 4k shown in FIG. 1 are able to lower the levels of all write enable signals (WE bar) except that for the memory device on which the software command will be written.

The AND gate circuits 4a to 4k supply low level write enable signals (WE bar) to the corresponding memory devices when the supplied memory selection signals Ba to 3k and the write enable signals (WE bar) are at the low level (in a significant state). As a result, the low level write enable signal (WE bar) is supplied to only the memory device to which the low level memory selection signal (S bar) has been supplied, so as to selectively bring the memory device to the write mode in which the software command can be written. The write enable signals (WE bar) for the other memory devices are maintained at the high level.

The erasing operation in the semiconductor storage apparatus 100 according to this embodiment will now be described. The basic operation of the semiconductor storage apparatus 100 is the same as that of the conventional semiconductor storage apparatus. Initially, an operation for erasing data from, for example, the memory device 2a will now be described. The erasing operation is performed under control of a control unit (not shown) similarly to the conventional structure. When the upper address signals ($A_{n+1}$ to $A_m$) 1b for selecting the memory device 2a are supplied from the control unit to the decoder 3, the decoder 3 lowers the level of only the memory selection signal 3a. Thus, the memory device 2a is activated. Since the level of the power supply source Vpp has been raised to the high level VppH, the memory device 2a is brought to the read/write mode. When the write enable signal (WE bar) 1d is set to the low level and the output enable signal (OE bar) 1c is set to the high level in the foregoing state, the output enable signal (OE bar) is set to the high level and the write enable signal (WE bar) is, by the AND gate circuit 4a, set to the low level in the memory device 2a, thus causing the mode to be the write mode. As a result, a state is realized in which the operation is performed in accordance with the software command written in the included command latch circuit.

Figure 8:
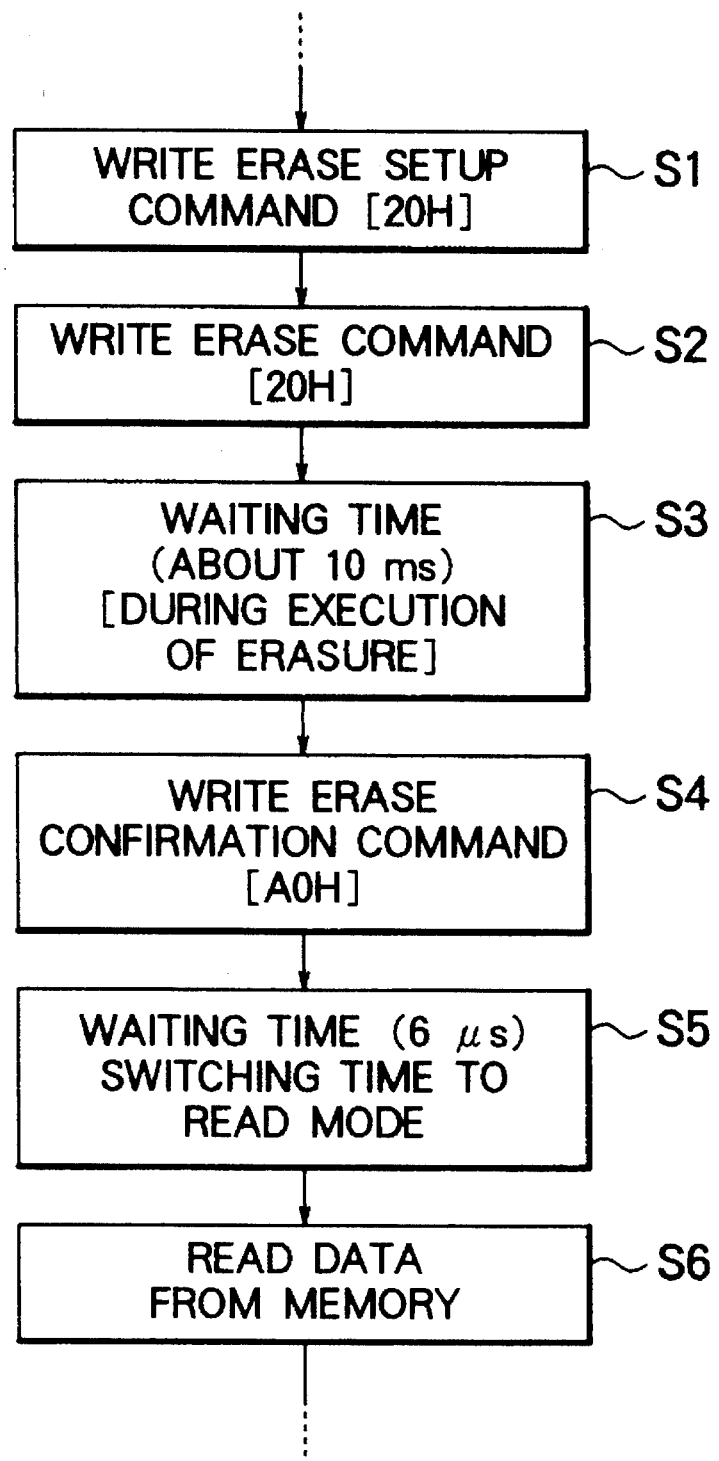
FIG. 8 is a portion of a flow chart showing a data erasing operation of the semiconductor data storage apparatus.

Then, the erasing command is written in the memory device 2a in accordance with the flow chart shown in FIG. 8 so that the erasing operation is performed. The period of step S3 or step S5 of the flow chart is the waiting time (10 ms or 6 µs). In the foregoing period, the level of the write enable signal (WE bar) for the memory device 2a is raised. By using the foregoing period, the upper address signal 1b is inputted to select the memory device 2b in the next stage. The activated memory device 2b is brought to the write mode to perform the erasing operation in accordance with the flow chart shown in FIG. 8. During the period in which the memory device 2b is selected, all levels of the memory selection signals 3a and 3c to 3k for the other memory devices 2a and 2c to 2k are raised. Therefore, the levels of the write enable signals (WE bar) to be supplied to the memory devices 2a and 2c to 2k are also raised by the AND gate circuits 4a to 4k. Thus, the erasing command can be written in the memory device 2b and data in the same can be erased during the operation for erasing data in the memory device 2a.

Also memory devices after the memory device 2b permit data erasure in the waiting time in step S3 or step S5 (10 ms or 6 µs) of the flow chart shown in FIG. 8. Therefore, the erasing command can be written in, for example, the memory device 2b during the operation of collectively erasing data in the memory device 2a. The erasing command can be written in the memory device 2c during the operation of collectively erasing data in the memory device 2b. The time required to write one software command, for example, the command "20H" shown in FIG. 8, is one hundred and tens of nano seconds. Assuming that the time is 200 nano seconds, the time required to write the command "20H" two times is 400 ns. It leads to a fact that erasing commands can be written in about 250,000 memory devices in the waiting time of, for example, 10 ms (milliseconds) in step S3 shown in FIG. 8. Since about twenty memory devices 2a to 2k are mounted on the semiconductor storage apparatus 100, data in all memory devices 2a to 2k can be erased sequentially in the execution of data erasure from the memory device 2a (during the waiting time).

Therefore, the waiting time that is the product of the waiting time for one memory device and the number of the memory devices can be shortened to the time near the waiting time for one memory device. Therefore, the time required to erase data can be shortened significantly.

The other operations, such as the data programming and reading operations, can be performed under similar control except that the write enable signals (WE bar) are supplied through the AND gate circuits 4a to 4k.

Second Embodiment

Figure 2:
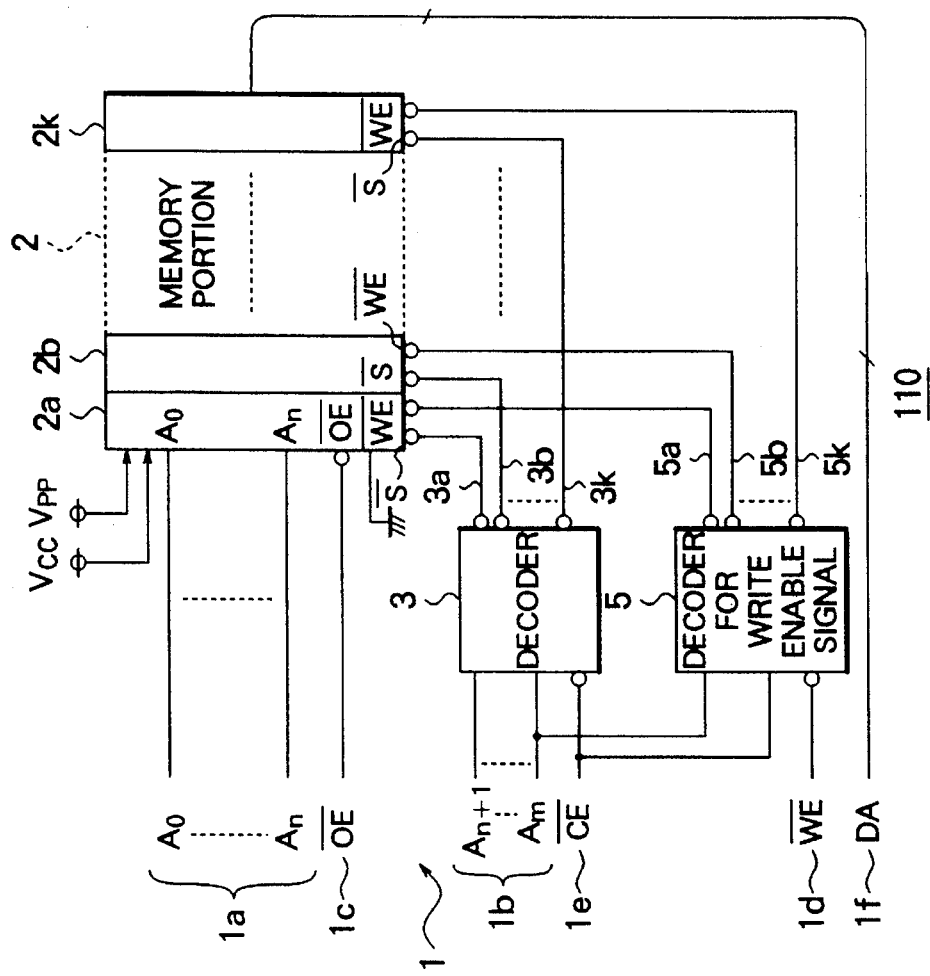
FIG. 2 is a block diagram which illustrates another embodiment of the semiconductor data storage apparatus according to the first aspect of the present invention.

FIG. 2 is a block diagram which illustrates another embodiment of the semiconductor data storage apparatus according to the first aspect of the present invention. Basically, the semiconductor data storage apparatus 110 according to this embodiment is structured on the same concept of the semiconductor data storage apparatus 100 according to the first embodiment. In order to selectively supply the low level write enable signals (WE bar) 1d to only the activated memory devices, the semiconductor data storage apparatus 110 according to this embodiment comprises a decoder 5 for a write enable signal, the decoder 5 serving as a write enable signal selection and supply means. The decoder 5 for a write enable signal comprises the same decoder circuit as that of the decoder 3. The decoder 5 for a write enable signal is activated when the level of the write enable signal (WE bar) d on the input side is low. Similarly to the decoder 3, the decoder 5 for a write enable signal selectively lowers the levels of the internal write enable signals (WE bar) 5a to 5k in accordance with the upper address signal 1b. Similarly to the first embodiment, the level of only the internal write enable signal (WE bar) 5a for the memory device 2a is lowered when the level of the memory selection signal 3a supplied from the decoder 3 to the memory device 2a is low. The levels of the other internal write enable signals (WE bar) 5b to 5k are high. When the level of the write enable signal (WE bar) 1d is high, the decoder 5 is deactivated and the levels of all internal write enable signals (WE bar) 5a to 5k are high. The other structures are the same as those according to the first embodiment and, thus, a similar effect of shortening the time required to erase data can be obtained.

Third Embodiment

Figure 3:
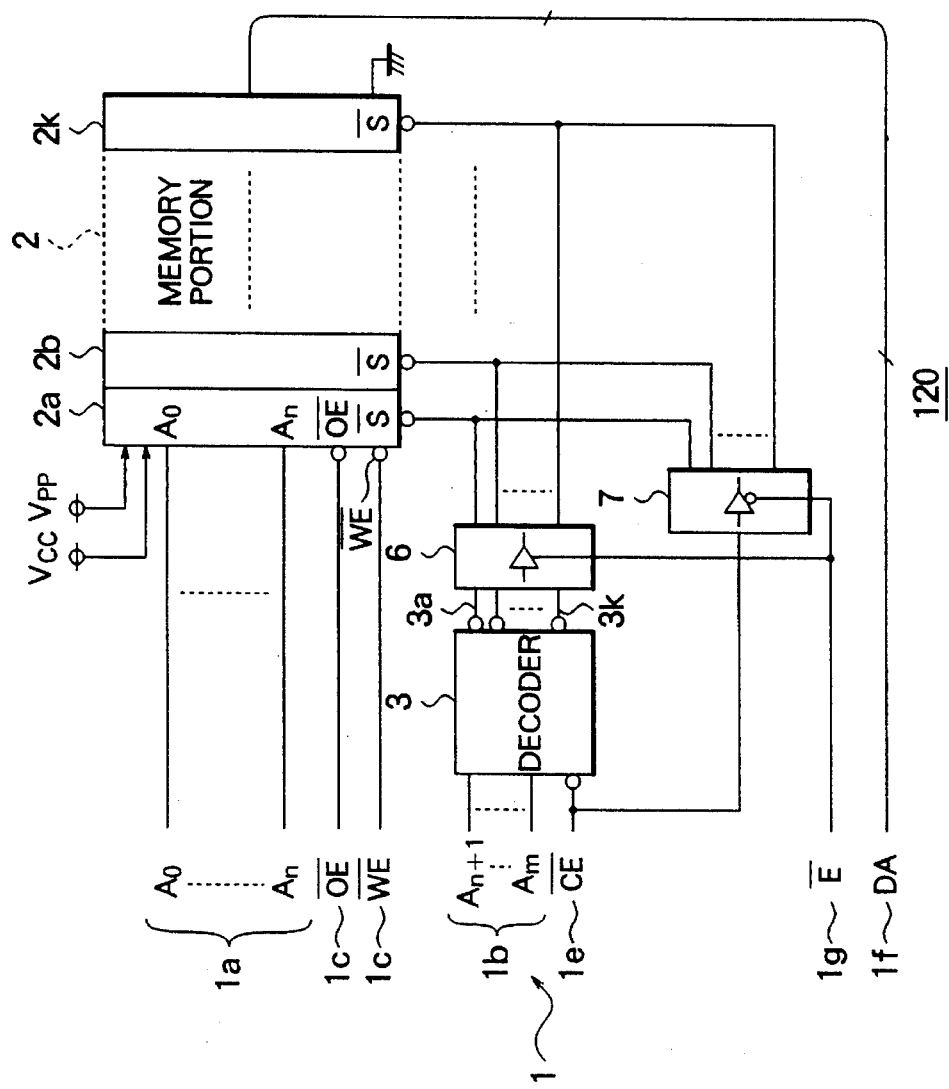
FIG. 3 is a block diagram which illustrates an embodiment of a semiconductor data storage apparatus according to a second aspect of the present invention.

FIG. 3 is a block diagram which illustrates an embodiment of a semiconductor storage apparatus according to a second aspect of the present invention. A semiconductor storage apparatus 120 shown in FIG. 3 has an arrangement that a parallel and collective erase command signal is supplied from outside to simultaneously and in parallel erase data from the plurality of memory devices 2a to 2k constituting the memory portion 2. In the semiconductor storage apparatus 120 shown in FIG. 3, reference numeral 1g represents a parallel and collective erase signal line (E bar) and 6 represents a first three-state buffer group for bringing all memory selection signal lines 3a to 3k of the decoder B to high impedance state "Hz" to invalidate the same when the parallel and collective erase signal (E bar) 1g on the parallel and collective erase signal line is at the low level (in the significant state). Reference numeral 7 represents a second three-state buffer group for supplying memory selection signals (S bar), the levels of which are those of the enable signals (CE bar) 1e, to all memory devices 2a to 2k in place of the memory selection signals 3a to 3k to be supplied from the decoder 3 when the parallel and collective erase signal line (E bar) 1g is at the low level (in the significant state). The level of the parallel and collective erase signal (E bar) 1g is lowered (brought to the significant state) when data items in all memory devices 2a to 2k are simultaneously erased. The level of the enable signal (CE bar) is, of course, at the low level (the semiconductor storage apparatus 120 is activated) at this time. Therefore, the low level memory selection signals (S bar) are simultaneously supplied to all memory devices 2a to 2k.

In a case where the parallel and collective erase signal (E bar) 1g is at the high level, that is, in a case where a usual operation is performed, the first three-state buffer group 6, as it is, transmits the memory selection signals 3a to 3k supplied from the decoder 3. All outputs from the second three-state buffer group 7 are brought to the high impedance state "Hz". Thus, the usual operation is not affected.

Note that the parallel and collective erase command signal comprises the parallel and collective erase signal (E bar) 1g and the parallel and collective erase control means comprises the first and second three-state buffer group 6 and 7 and the write enable signal (WE bar) 1d.

The operation of the parallel and collective erase operation will now be described briefly. When the parallel and collective erase operation is performed, each memory device is brought to the read/write mode. Furthermore, the level of the parallel and collective erase signal (E bar) 1g is lowered. As a result, all memory selection signal lines 3a to 3k of the decoder 3 are brought to the high impedance state "Hz" as described above. As an alternative to this, the second three-state buffer group 7 supplies the low level memory selection signals (S bar), the levels of which are those of the enable signal (CE bar) 1e, to all memory devices 2a to 2k. As a result, all memory devices 2a to 2k are simultaneously activated. When the write enable signal (WE bar) 1d is set to the low level and the output enable signal (OE bar) 1c is set to the high level in the foregoing state, all memory devices 2a to 2k are brought to the write mode. When the data erasing operation is performed in accordance with the flow chart shown in FIG. 8, data erasure of all memory devices 2a to 2k is performed simultaneously. Thus, the waiting time for one memory device is required even if data is erased from all memory devices 2a to 2k. As a result, the time required to erase data can be shortened significantly.

Fourth Embodiment

Figure 4:
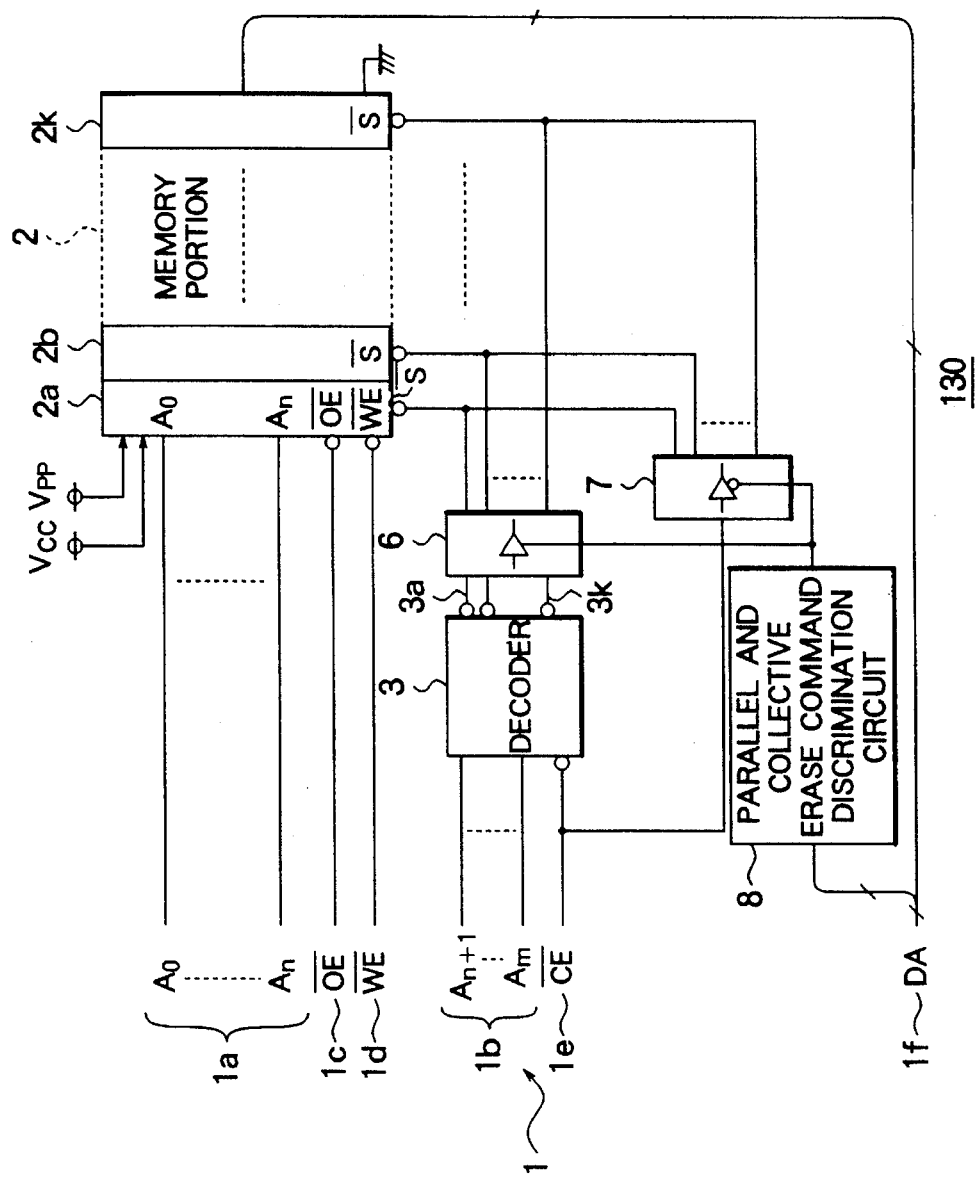
FIG. 4 is a block diagram which illustrates another embodiment of the semiconductor data storage apparatus according to the second aspect of the present invention.

FIG. 4 is a block diagram which illustrates another embodiment of a semiconductor data storage apparatus according to the second aspect of the present, invention. A semiconductor data storage apparatus 130 according to this embodiment is structured on the same concept of the semiconductor data storage apparatus 120 according to the third embodiment. The semiconductor data storage apparatus 130 according to this embodiment has an arrangement that a predetermined parallel and collective erase command composed of parallel signals is, as the parallel and collective erase command signal, written through a data bus (DA) If in place of the parallel and collective erase signal (E bar) 1g shown in FIG. 3; and in accordance with the foregoing command, the parallel and collective erase operation is performed.

Figure 5:
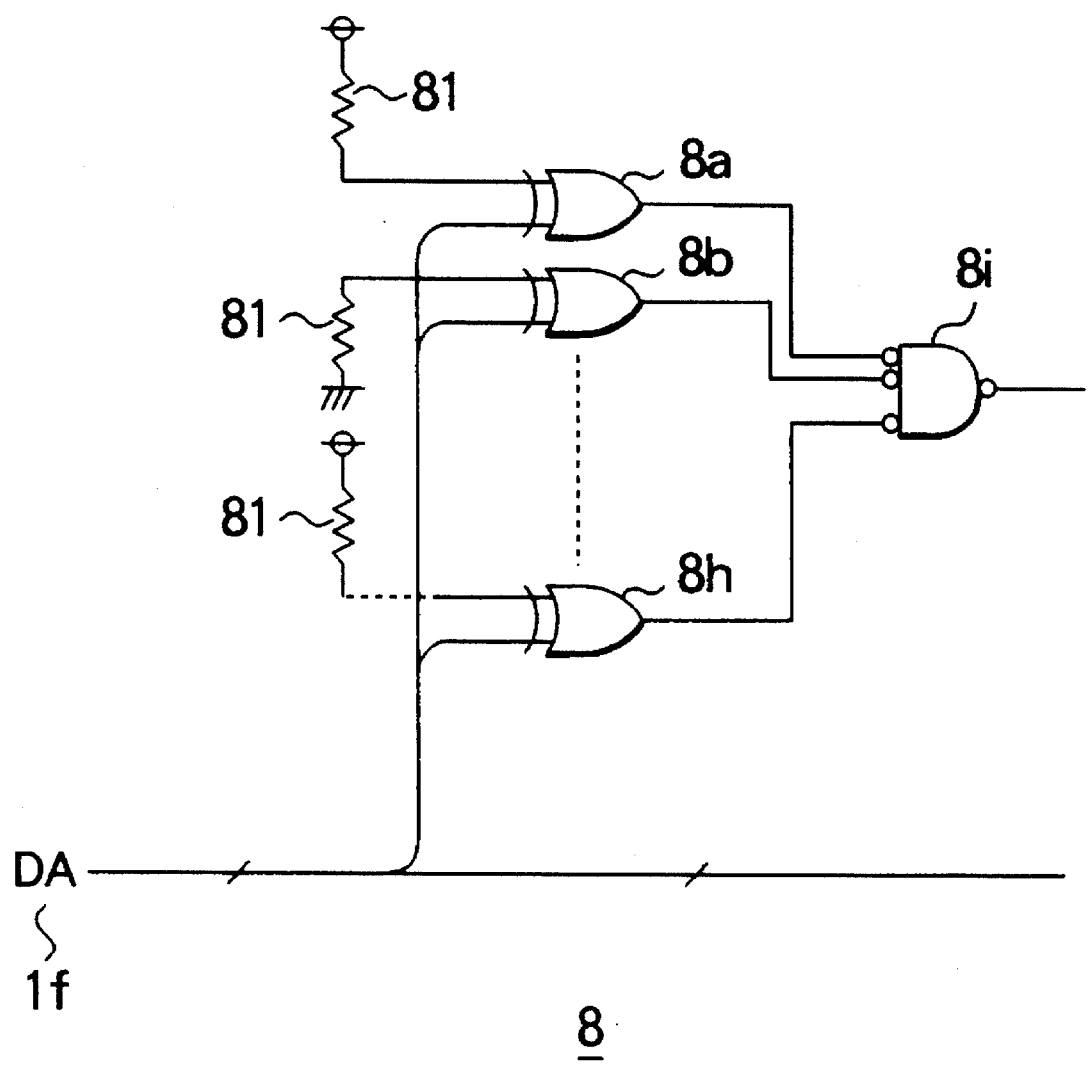
FIG. 5 is a circuit diagram which illustrates an example of a parallel and collective erase command discrimination circuit.

Referring to FIG. 4, reference numeral 8 represents a parallel and collective erase command discrimination circuit for detecting supply of a predetermined parallel and collective erase command from the data bus If. FIG. 5 illustrates an example of the parallel and collective erase command discrimination circuit. Referring to FIG. 5, reference numerals 8a to 8h represent, for example, eight (the number of bits of the maximum data bus) XOR circuits (exclusive OR circuits), 8i represents a negative logic AND gate circuit, and 81 represents a pull-up or pull-down resistor. The pull-up resistors and pull-down resistors 81 generate predetermined parallel and collective erase commands. The XOR gate circuits 8a to 8h, for each bit, compare the internal commands and a command signal written through the data bus 1f to detect and determine that the parallel and collective erase command has been written on the data bus 1f. The AND circuit 83 generates a low level output only when coincidence has been confirmed in the XOR circuits 8a to 8h and a determination has been made that the parallel and collective erase command has been written.

The parallel and collective erase command signal is composed of the parallel and collective erase command, the parallel and collective erase control means comprises the first and second three-state buffer groups 6 and 7 and the write enable signal (WE bar) 1d, and the parallel and collective erase command signal discrimination means comprises the parallel and collective erase command discrimination circuit 8.

The operation of the semiconductor data storage apparatus 130 according to this embodiment is basically the same as that according to the third embodiment. When a predetermined parallel and collective erase command is, through the data bus (DA) 1f, written in place of the parallel and collective erase signal (E bar) 1g, the parallel and collective erase command discrimination circuit 8 detects this and the level of the output is lowered. Thus, the first three-state buffer group 6 invalidates all memory selection signals 3a to 3k to be supplied from the decoder 3. Simultaneously, the second three-state buffer group 7 supplies the low level memory selection signals to all memory devices 2a to 2k because the enable signal (CE bar) 1e is at the low level. Thus, all memory devices 2a to 2k are activated. As a result, similarly to the third embodiment, data erasure from all memory devices 2a to 2k can be performed simultaneously, thus resulting in a similar effect.

Although the memory device according to the first to fourth embodiments has the arrangement that the erase command is written to collectively erase data from the overall memory portion one memory device, the present invention can be applied to a semiconductor data storage apparatus having a memory device of a type that the memory portion in one memory device is divided into a plurality of blocks and data erasure for each block can be performed by writing a predetermined erase command. In this case, the operation of each embodiment for each block of each memory device can be performed.

Fifth Embodiment

Figure 6:
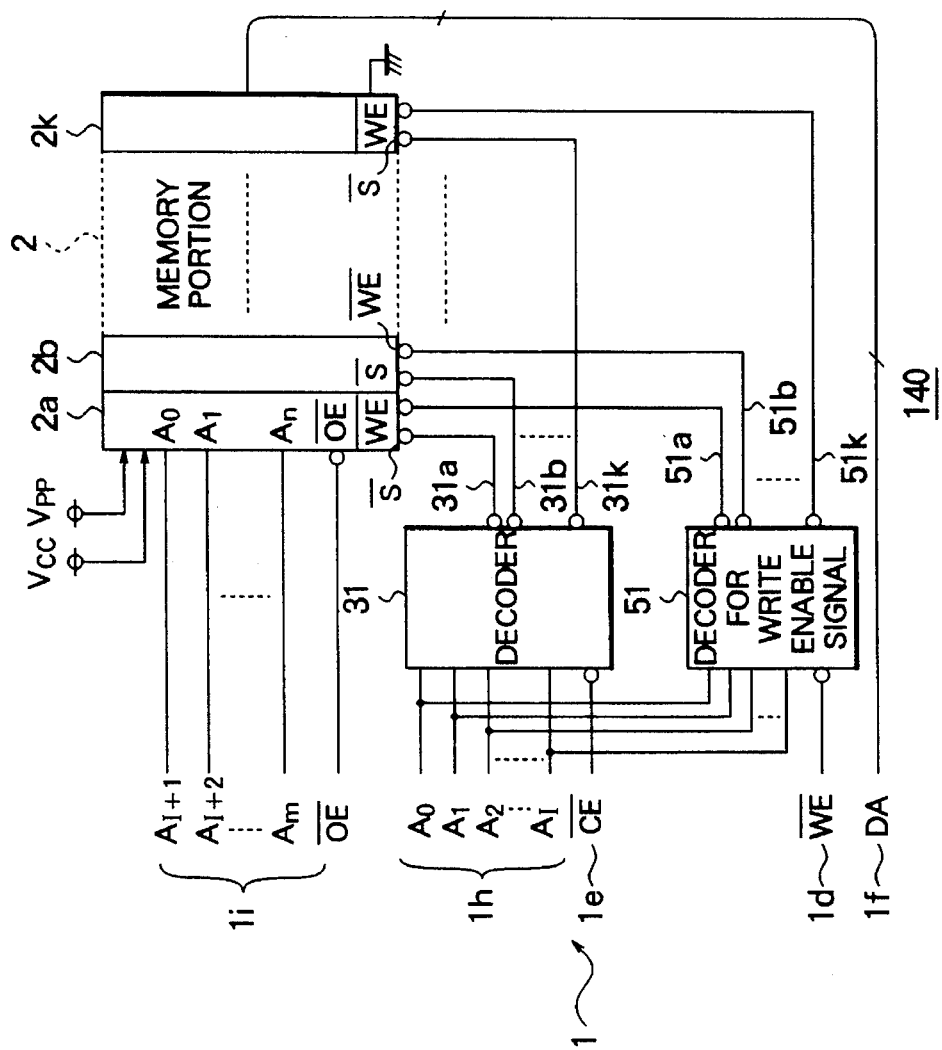
FIG. 6 is a block diagram which illustrates an embodiment of a semiconductor data storage apparatus according to a third aspect of the present invention.
Figure 7:
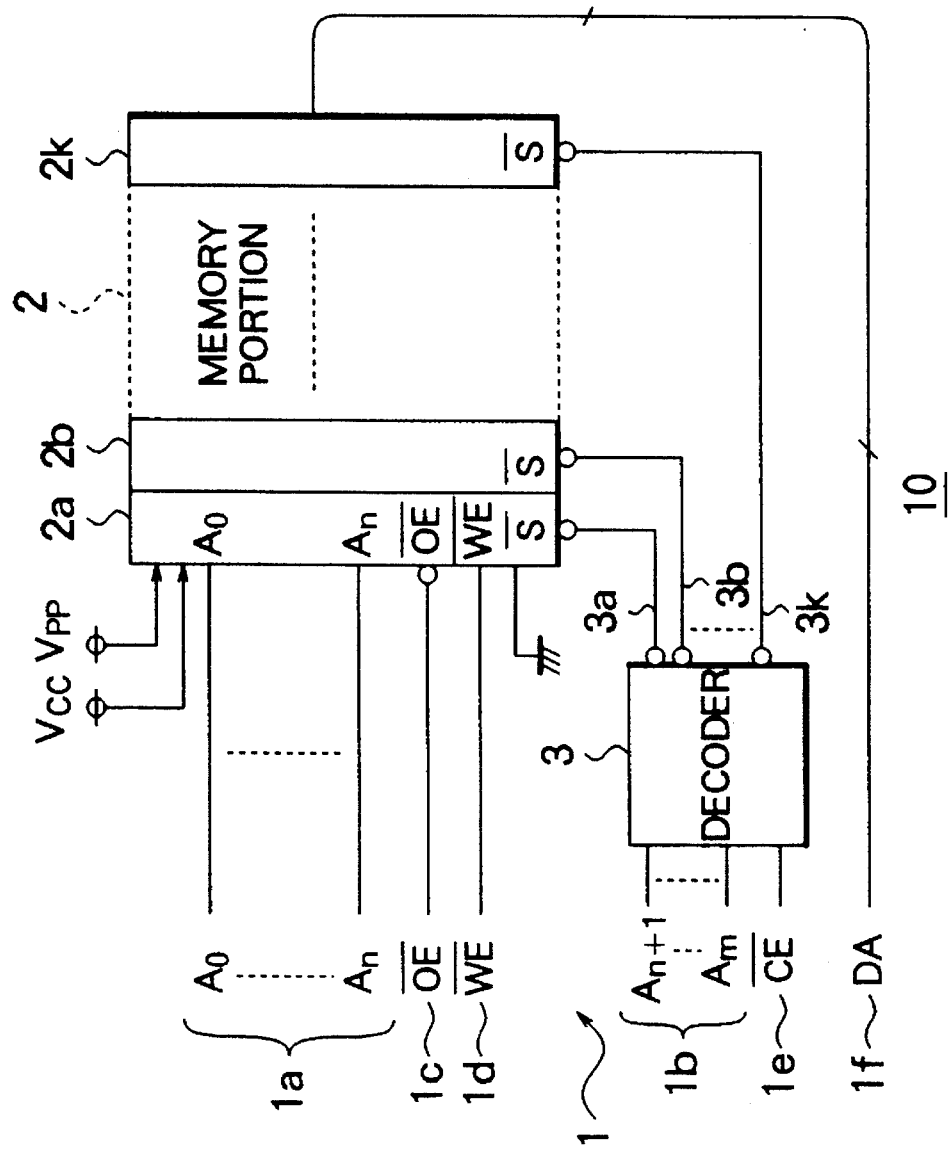
FIG. 7 is a block diagram which illustrates a conventional semiconductor data storage apparatus.

FIG. 6 is a block diagram which illustrates an embodiment of the data semiconductor storage apparatus according to a third aspect of the present invention. A semiconductor data storage apparatus 140 shown in FIG. 6 enables data programming to be performed in such a manner that data of one byte can be sequentially programmed in an otter from the memory device 2a to the memory device 2k. Semiconductor data storage apparatus of the foregoing type have an arrangement that, for example, the memory device 2a is filled with programmed data and then data is programmed on the next memory device 2b. That is, data programming is performed in the vertical direction of the memory portion 2 when viewed in FIG. 6. On the other hand, the semiconductor data storage apparatus 40 according to this embodiment permits data to be programmed in the horizontal direction. One byte data is sequentially programmed in each first address portion in an order from the memory device 2a to the memory device 2k. When data has been programmed in the first address of the final memory device 2k, the programming operation returns to the memory device 2a so that data is sequentially programmed in each second address portion in the order from the memory device 2a to the memory device 2k. Then, the foregoing process is repeated. As a result, data can be sequentially programmed to the next memory device during the waiting time (steps S3 and S5) in the data programming flow chart shown in FIG. 9. Thus, the waiting time can be efficiently used and, therefore, the time required to program data can be shortened. In order to perform the foregoing operation, a method contrary to the conventional method is employed in which the upper address signal is supplied to each memory device and the lower address signal is supplied to the decoder.

In the semiconductor storage apparatus 140 shown in FIG. 6, reference numeral 1i represents an upper address signal line group ($A_{l+1}$ to $A_m$), 1h represents a lower address signal line group ($A_0$ to $A_1$), 31 represents a decoder for the memory selection signal (S bar), 31a to 31k represent the group of memory selection signal lines (S bar) which are output lines from the decoder 31, 51 represents a decoder for the write enable signal (WE bar) and 51a to 51k represent internal write enable signal line group (WE bar) which are output line from the decoder 51.

The decoder 31 selectively lowers (brings to a significant state) the levels of the memory selection signals 31a to 31k in accordance with the lower address signals ($A_0$ to $A_1$) 1h when the enable signal (CE bar) 1e is at the low level (in the significant state) so as to selectively activate the memory devices 2a to 2k. The decoder 51 for the write enable signal selectively lowers (brings to the significant state) the levels of the write enable signals (WE bar) 51a to 51k in accordance with the lower address signals ($A_0$ to $A_1$) 1h when the write enable signal (WE bar) 1d is at the low level (in the significant state) so as to selectively bring the memory devices 2a to 2k to the write mode. Since the two decoders 31 and 51 similarly receive the lower address signals ($A_0$ to $A_1$), the low level (the significant state) write enable signal is supplied to the activated memory device. Whenever the address is increased by plus one, the next memory device is selected. Thus, the upper address signals ($A_{l+1}$ to $A_m$) 1i are supplied to the memory devices 2a to 2k.

The memory selection means comprises the decoder 31 and the write enable signal selection and supply means comprises the decoder 51 for the write enable signal.

When data is written in several bytes from the address of the memory device 2a of the semiconductor data storage apparatus 140 having the foregoing structure, the lower address signals ($A_0$ to $A_1$) 1h are increased by one during the execution of step S3 or step S5 of the flow chart for the program shown in FIG. 9 or during the waiting time (10 μs or 6 μs) for confirming the program so as to program data. Since the outputs from the two decoders 31 and 51 are made such that levels of the memory selection signal (S bar) 31b and the write enable signal (WE bar) 51b to be transmitted to the memory device 2b are lowered, data is programmed in the memory device 2b. During the programming of data in the memory device 2b, the lower address signals (As to $A_1$,) 1h are similarly increased by plus one in the waiting time of step S3 or step S5 of the flow chart for the program shown in FIG. 9 so that data is programmed. As a result, data is programmed in the memory device 2c. By repeating the foregoing operation, data can be horizontally programmed on the memory devices 2a to 2k. The time required to write one software command, the address and data is one hundred and tens of nano seconds as described above. Assuming that the time is 200 ns, the time required to write one command and one set of an address and data is about 400 ns. Thus, it can be estimated that a program command for writing, for example, one byte data in about 25 memory devices can be written during the waiting time of 10 μs (microsecond) of step S3 shown in FIG. 9. Since the semiconductor data storage apparatus of the foregoing type usually has about 20 memory devices mounted thereon, one byte data can be programmed in all memory devices 2b to 2k during the waiting time involved to execute a program for the memory device 2a. Therefore, the waiting time during the programming operation can be used efficiently and, thus, the time required to program data can be shortened significantly.

If the programming operation in step SB for the memory device 2a has been completed before the program command is written in the final memory device 2k, the period until the moment the program command is written on the memory device 2k is made to be the waiting time.

As described above, the semiconductor data storage apparatus according to the first comprehensive aspect of the present invention has the arrangement that memory selection means and write enable signal selection and supply means bring the next memory device to the write mode in a waiting time during the collective erasure of data so as to write the erase command for the purpose of erasing data and the foregoing process is repeated. Thus, data can be erased from all memory devices during the waiting time involved with the first memory device. Therefore, an effect can be obtained in that a semiconductor data storage apparatus capable of significantly shortening the time required to erase data can be provided.

The semiconductor data storage apparatus according to the second comprehensive aspect of the present invention has the arrangement that the parallel and collective erase control means simultaneously activate all memory devices when the parallel and collective erase command signal has been supplied so as to enable the erase operations to be performed simultaneously. Therefore, an effect can be obtained in that a semiconductor data storage apparatus capable of significantly shortening the time required to erase data can be provided.

The semiconductor data storage apparatus according to the third comprehensive aspect of the present invention has the arrangement that: the write enable signal selection and supply means and the memory selection means are supplied with the lower address signals; each memory device is supplied with the upper address signal; the data program is arranged to select the next memory device whenever the address is increased by plus one, so that one byte data can be sequentially programmed on each memory device (data can be programmed in the horizontal direction). Since a program command can be once written in all memory devices during the waiting time involved in one process, a semiconductor data storage apparatus capable of significantly shortening the time required to erase data can be provided.

What is claimed is:

1. A semiconductor data storage apparatus comprising:
   data storage means including a plurality of memory devices into which bytes of data can be programmed in a write mode of the respective memory devices in response to memory selection and write enable signals applied to the memory devices, each of the memory devices having a plurality of sequential address portions into which data can be written, programming of data into an address portion including, during a first wait period, (i) initially writing data into an address portion as written data, (ii) after a second wait period, reading the written data from the address portion as read data, and (iii) confirming agreement of the written data and the read data;

memory selection means for supplying the memory selection signals to the memory devices for selectively activating respective memory devices in response to lower address signals specifying which memory devices are to be activated; and write enable signal selection and supply means for supplying write enable signals to the memory devices for bringing the memory devices into the write mode in response to the lower address signals, the write enable signals being supplied simultaneously with the memory selection signals, wherein the write enable signal selection and supply means, after supplying a write enable signal to a first of the plurality of memory devices for writing data into a first address portion of the first memory device, during one of the first and second wait times, in response to each increase in the lower address signals by one, sequentially activates the other memory devices so that sequential programming of the other memory device begins while data is being written into the first address portion of the first of the memory devices whereby the time required to program one byte into each of the memory devices is reduced.

2. The semiconductor data storage apparatus according to claim 1 wherein:

the memory selection means comprises a first decoder for supplying the memory selection signals to the memory devices in response to the lower address signals, and the write enable signal selection and supply means comprises a second decoder that supplies the write enable signals to the memory devices in response to the lower address signals.

* * * * *